United States Patent
Song et al.

(10) Patent No.: US 11,104,043 B2
(45) Date of Patent: Aug. 31, 2021

(54) THERMAL EXTRUSION METHOD TO FABRICATE LARGE-DIMENSION SUPERHYDROPHOBIC CYLINDER PILLAR ARRAYS WITH DROPLET PANCAKE BOUNCING PHENOMENON

(71) Applicant: DALIAN UNIVERSITY OF TECHNOLOGY, Dalian (CN)

(72) Inventors: Jinlong Song, Dalian (CN); Liu Huang, Dalian (CN); Changlin Zhao, Dalian (CN); Mingqian Gao, Dalian (CN); Xin Liu, Dalian (CN)

(73) Assignee: DALIAN UNIVERSITY OF TECHNOLOGY, Liaoning (CN)

( * ) Notice: Subject to any disclaimer, the term of this patent is extended or adjusted under 35 U.S.C. 154(b) by 334 days.

(21) Appl. No.: 16/337,364

(22) PCT Filed: Aug. 28, 2017

(86) PCT No.: PCT/CN2017/099362
§ 371 (c)(1),
(2) Date: Mar. 27, 2019

(87) PCT Pub. No.: WO2019/010764
PCT Pub. Date: Jan. 17, 2019

(65) Prior Publication Data
US 2020/0009763 A1    Jan. 9, 2020

(30) Foreign Application Priority Data
Jul. 13, 2017    (CN) .......................... 201710568996.X

(51) Int. Cl.
B29C 37/00    (2006.01)
B29C 33/38    (2006.01)
(Continued)

(52) U.S. Cl.
CPC .......... B29C 37/0053 (2013.01); B29C 33/38 (2013.01); B29C 51/00 (2013.01);
(Continued)

(58) Field of Classification Search
CPC ...... G03F 7/0002; B29C 41/26; B29C 59/022
(Continued)

(56) References Cited

U.S. PATENT DOCUMENTS

| 7,105,072 B2 * | 9/2006 | Lin | ........................... B26F 1/24 156/219 |
| 8,439,666 B2 * | 5/2013 | Rolland | .................. B29C 33/42 425/177 |

(Continued)

FOREIGN PATENT DOCUMENTS

| CN | 101879781 A | 11/2010 |
| CN | 103724639 A | 4/2014 |

(Continued)

OTHER PUBLICATIONS

Pazokifard, Shahla, et al. "Fluoroalkylsilane treatment of TiO2 nanoparticles in difference pH values: Characterization and mechanism." Advanced Powder Technology 23.4 (Apr. 16, 2012): 428-436. (Year: 2012).*

(Continued)

*Primary Examiner* — Benjamin A Schiffman
(74) *Attorney, Agent, or Firm* — Muncy, Geissler, Olds & Lowe, P.C.

(57) ABSTRACT

A thermal extrusion method to fabricate large-dimension superhydrophobic cylinder pillar arrays with droplet pancake bouncing phenomenon. Preparing thermal extrusion mold: the through-hole arrays with 0.8~1.25 mm diameter, 0.25 mm interval space and 0.6~1.0 mm height are first obtained on metals, and are then polished, rinsed and dried. Thermal extrusion: polymer materials are first thermally (Continued)

extruded on the obtained mold and cooled to room temperature. Demold: excess polymer materials flowing from the through hole are cut off and then the polymer cylinder pillar arrays are lifted off from the mold. Superhydrophobic treatment: the whole polymer sample is treated using mixed liquid spray consisting of titanium oxide nanoparticles dispersed in fluoroalkylsilane ethanol solution, and the superhydrophobic cylinder pillar arrays are obtained. The method is easy to operate, low-cost, recyclable, effective for different polymer materials, and can obtain cylinder pillar arrays with large dimensions, which can realize efficient large-area and industrial fabrication of the droplet pancake bouncing surfaces.

3 Claims, 2 Drawing Sheets

(51) Int. Cl.
  *B29C 51/00* (2006.01)
  *B29C 59/02* (2006.01)
  *B01J 2/30* (2006.01)
  *G03F 7/00* (2006.01)

(52) U.S. Cl.
  CPC .............. *B29C 59/022* (2013.01); *B01J 2/30* (2013.01); *B29C 2059/023* (2013.01); *B29K 2995/0093* (2013.01); *G03F 7/0002* (2013.01)

(58) Field of Classification Search
  USPC .................................................. 264/284, 293
  See application file for complete search history.

(56) References Cited

U.S. PATENT DOCUMENTS

| | | | | |
|---|---|---|---|---|
| 8,540,888 | B1* | 9/2013 | Yang | G03F 7/0002 216/41 |
| 8,833,430 | B2* | 9/2014 | Aizenberg | B82Y 40/00 164/6 |
| 8,911,655 | B2* | 12/2014 | Minoura | B29C 59/04 264/293 |
| 8,961,800 | B2* | 2/2015 | Sreenivasan | B82Y 10/00 216/40 |
| 9,329,544 | B2* | 5/2016 | Kim | B82Y 40/00 |
| 9,469,083 | B2* | 10/2016 | Choi | G03F 7/0002 |
| 9,956,743 | B2* | 5/2018 | Jin | H01L 31/0236 |
| 10,185,218 | B2* | 1/2019 | Chung | G03F 7/0002 |
| 10,189,704 | B2* | 1/2019 | Checco | H01L 21/0273 |
| 10,239,279 | B2* | 3/2019 | Koike | B32B 37/025 |
| 10,268,114 | B2* | 4/2019 | Sun | G03F 7/038 |
| 10,471,646 | B2* | 11/2019 | Mead | B29C 59/04 |
| 2012/0052241 | A1* | 3/2012 | King | B08B 17/065 428/141 |
| 2015/0044417 | A1* | 2/2015 | Koike | B82Y 10/00 428/137 |
| 2015/0368417 | A1* | 12/2015 | Omenetto | B41C 1/10 428/156 |
| 2016/0032111 | A1* | 2/2016 | Yeh | C09D 5/084 252/389.31 |
| 2017/0050343 | A1 | 2/2017 | Wei et al. | |
| 2018/0059291 | A1* | 3/2018 | Li | G03F 7/0002 |
| 2019/0091950 | A1* | 3/2019 | Hernandez Rueda | G03F 7/0002 |

FOREIGN PATENT DOCUMENTS

| | | |
|---|---|---|
| CN | 105619774 A | 6/2016 |
| CN | 106182725 A | 12/2016 |
| KR | 10-2013-0123529 A | 11/2013 |
| KR | 10-1641585 B1 | 7/2016 |

OTHER PUBLICATIONS

McDonald, Brendan, Hamed Shahsavan, and Boxin Zhao. "Biomimetic Micro-Patterning of Epoxy Coatings for Enhanced Surface Hydrophobicity and Low Friction." Macromolecular Materials and Engineering 299.2 (Jul. 9, 2013): 237-247. (Year: 2013).*

Liu, Yahua, et al. "Pancake bouncing on superhydrophobic surfaces." Nature physics 10.7 (Jun. 8, 2014): 515-519. (Year: 2014).*

Yuan, Lifang, et al. "Engineering superlyophobic surfaces on curable materials based on facile and inexpensive microfabrication." Journal of Materials Chemistry A 2.19 (Feb. 21, 2014): 6952-6959. (Year: 2014).*

Liu, Yahua, et al. "Controlling drop bouncing using surfaces with gradient features." Applied Physics Letters 107.5 (Aug. 4, 2015) : 051604. (Year: 2015).*

Song, Jinlong, et al. "Large-area fabrication of droplet pancake bouncing surface and control of bouncing state." ACS nano 11.9 (Aug. 25, 2017): 9259-9267. (Year: 2017).*

Yoo, Daekyoung, et al. "Highly reliable superhydrophobic protection for organic field-effect transistors by fluoroalkylsilane-coated TiO2 nanoparticles." ACS nano 12.11 (Oct. 10, 2018): 11062-11069. (Year: 2018).*

Graeber, Gustav, et al. "3D-printed surface architecture enhancing superhydrophobicity and viscous droplet repellency." ACS applied materials & interfaces 10.49 (Nov. 19, 2018): 43275-43281. (Year: 2018).*

Song, Jinlong, et al. "Robust superhydrophobic conical pillars from syringe needle shape to straight conical pillar shape for droplet pancake bouncing." ACS applied materials & interfaces 11.48 (Oct. 25, 2019): 45345-45353. (Year: 2019).*

Liu, Cong, et al. "Design of superhydrophobic pillars with robustness." Surface and Coatings Technology 361 (Jan. 11, 2019): 342-348. (Year: 2019).*

* cited by examiner

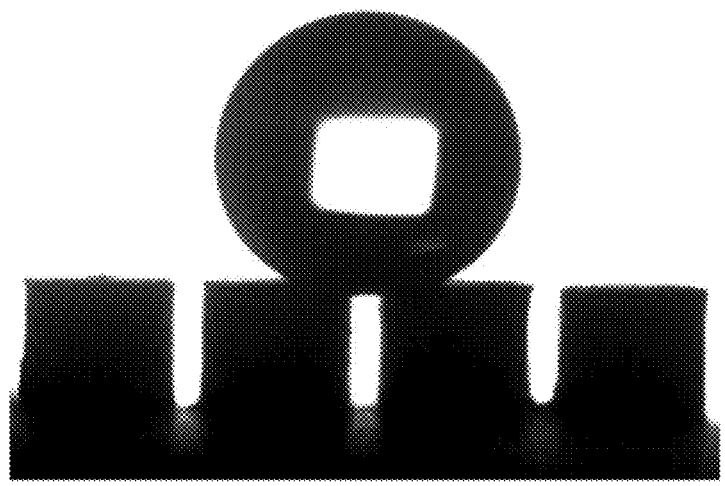
Fig. 4(Fig.4 as an illustration in Abstract)

THERMAL EXTRUSION METHOD TO FABRICATE LARGE-DIMENSION SUPERHYDROPHOBIC CYLINDER PILLAR ARRAYS WITH DROPLET PANCAKE BOUNCING PHENOMENON

FIELD OF THE INVENTION

The present invention relates to micro-machining field, and specifically to a thermal extrusion method to fabricate large-dimension superhydrophobic cylinder pillar arrays with droplet pancake bouncing phenomenon.

BACKGROUND OF THE INVENTION

The freezing rain is common in nature, but it is very easily to adhere and freeze on solid surfaces and cause damage to human life and production. For instance, the freezing rain adhered on the transmission lines would cause the collapse of power tower; the freezing rain adhered on the road would reduce the friction between road and pedestrian or vehicle, increasing the injury and fatality rates; the freezing rain adhered on the aircraft wings would decrease aircraft lift, increase aircraft drag, and even cause severe air crashes. Therefore, it is necessary to develop some effective methods to reduce the adhesion between the freezing rain and solid surfaces in order to reduce the freezing damages. Superhydrophobic surfaces with large contact angles and small sliding angles have attracted researchers' attention, and they hope to make use of the feature that water droplets impacting on superhydrophobic surfaces have less contact time and can roll off easily to prevent the freezing rain from adhering on the surfaces. When water droplets impact on superhydrophobic surfaces, it often spread first, then recoil, and finally detach from the surface. For a droplet with a certain volume, the liquid-solid contact time is independent of the impact velocities. How to further reduce the liquid-solid contact time is of great significance for improving the anti-icing properties of superhydrophobic surfaces from the freezing rain environment. In 2014, Bird et al. found that the liquid-solid contact time could be reduced by 37% when water droplets impacted on the superhydrophobic microscope ridge with a height of 180 μm on the superhydrophobic flat surfaces (Nature. 2014, 505(7483)). In 2015, Gauthier et al. further studied the influence of ridge textures with diameter or height of tens to hundreds of millimeters on the super-hydrophobic flat surfaces on the contact time. The results showed that the contact time was reduced obviously without splitting (Nature Communications. 2015, 6(8001)). In the same year, Liu et al. also reduced the contact time when the droplet impinged on the striplike cylindrically curved surfaces of a few millimetres in diameter, which was laterally placed on the superhydrophobic flat surfaces (Nature Communications. 2015, 6(10034)). Although the aforementioned surface textures can reduce the contact time effectively, they might not be suitable for practical applications for the reason that most rain droplets will not touch ridges or cylindrically curved surfaces. In 2014, Liu et al. observed pancake bouncing on the superhydrophobic submillimeter-scale tapered or square pillar arrays with the liquid-solid contact time reduced by 80%. These large-area pillar arrays can ensure that all water droplets touch the surface texture, and are therefore suitable for practical applications. The diameter and height of the pillars designed by Liu were 20~100 μm and 800~1200 μm respectively, which could only be fabricated by electric spark cutting due to their small diameter and large height-diameter ratio. However, the processing efficiency of electric spark cutting for those pillar arrays was rather low that processing a 2×2 $cm^2$ sample needed 7~8 hours, which hinder the large-area fabrication and industrial application of droplet pancake bouncing surface. Therefore, it is significant to design new structures which not only can generate droplet pancake bouncing but also are suitable for large-area fabrication. In addition, more importantly, a new method that can large-area fabricate the droplet pancake bouncing surface is also needed to be developed.

SUMMARY OF THE INVENTION

The present invention firstly aims to provide new structures that not only can generate droplet pancake bouncing but also are suitable for large-area fabrication. Then the present invention aims to provide a method that can large-area fabricate the aforementioned new structures. The present invention mainly proposes that the superhydrophobic cylinder pillar arrays with 0.8~1.25 mm diameter, 0.25 mm interval space and 0.6~1.0 mm height can also obtain droplet pancake bouncing, and the method of thermal extrusion replication using porous array mold is adopted to fabricate large-area droplet pancake bouncing surfaces.

The technical solution of the present invention:

A thermal extrusion method of fabricating superhydrophobic cylinder pillar arrays with large dimensions which can generate droplet pancake bouncing phenomenon. The preparation steps are as follows:

(1) Preparing thermal extrusion mold: the through-hole arrays with 0.8~1.25 mm diameter, 0.25 mm interval space and 0.6~1.0 mm depth are first obtained on metals, and then rinsed and dried. The aforementioned metals can be aluminum (Al), copper, mold steel and stainless steel.

(2) Thermal extrusion: based on the obtained mold, the polymer plates are first thermally extruded on the mold and cooled to room temperature. The aforementioned polymer plates can be polypropylene (PP), polycarbonate (PC), polyethylene (PE) and polytetrafluoroethylene (PTFE).

(3) Demold: excess polymer materials flowing from the through hole are cut off and then the polymer cylinder pillar arrays are lifted off from the mold.

(4) Superhydrophobic treatment: the superhydrophobic cylinder pillar arrays are obtained via spraying the mixed 1 wt. % fluoroalkylsilane ethanol solution containing titanium oxide nanoparticles and being dried in the air. The mass ratio of titanium oxide nanoparticles and ethanol solution of fluoroalkylsilane in the aforementioned mixture should not be lower than 1:25.

The advantages of the present invention:

(1) The proposed cylinder pillar arrays with large dimensions and low height-diameter ratio can be fabricated more easily and efficiently.

(2) The present invention fabricates superhydrophobic cylinder pillar arrays by using mold-replicating macroscopic pillar arrays and spraying nano-coatings. The mold can be recycled, and it is facile and of low cost to fabricate large-area pancake bouncing surfaces.

(3) The present invention is mainly used to process different kinds of polymer materials with the characteristics of small density, high specific strength, low diathermancy, high insulation and low cost.

(4) The superhydrophobic cylinder pillar arrays obtained by the present invention can reduce the liquid-solid contact time by 60%.

DESCRIPTION OF THE DRAWING

FIG. 2(*b*) is a SEM image of the superhydrophobic PP cylinder pillar arrays on a scale of 0.1 mm.

FIG. 4 is a schematic diagram of hydrophobicity of the obtained superhydrophobic PP cylinder pillar arrays.

In FIGS.: 1—through-hole arrays mold on Al substrate; 2—drilling tool; 3—thermal extrusion; 4—polymer materials; 5—upper press plate of the punch; 6—heating and pressing; 7—bottom press plate of the punch; 8—cutting off and demold; 9—spraying.

MODE OF CARRYING OUT THE INVENTION

Combined with drawings and technical solutions, the following statements will further illustrate the mode of carrying out the present invention.

EMBODIMENT

Figure 1:
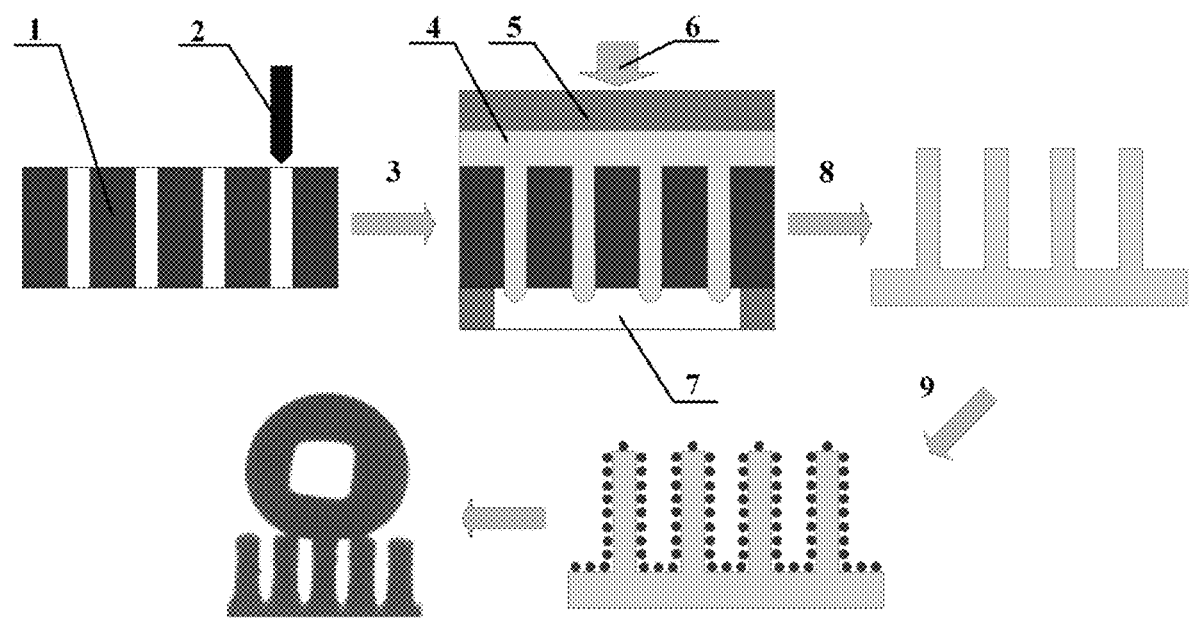
FIG. 1 is a schematic diagram of the thermal extrusion replication using porous array mold to fabricate superhydrophobic cylinder pillar arrays.

The method of thermal extrusion replication using porous array mold is adopted to fabricate superhydrophobic cylinder pillar arrays which can generate droplet pancake bouncing phenomenon, as shown in FIG. 1. Specific methods are as follows:

(1) Preparing thermal extrusion mold: the Al plates (1 mm thick) were first polished using #800 and #1500 abrasive paper, respectively, and then ultrasonically cleaned with deionized water to remove the surface oxide layer and grease. The through-hole arrays with 1.05 mm diameter, 0.25 mm interval space and 1.0 mm depth were first obtained by drilling, which were then polished with #1500 abrasive paper to remove surface burr followed by rinsing with deionized water and drying.

(2) Thermal extrusion: the through-hole arrays mold obtained in step 1 was put on the bottom press plate of the punch, and PP plates were just fixed on the upper press plate of the punch. Then the pressure of the punch was adjusted as 2000 Pa after setting the temperature of substrate to 180° C., and the mold materials were cooled to room temperature after baking for 10 min and releasing the pressure.

Figures 2A, 2B:
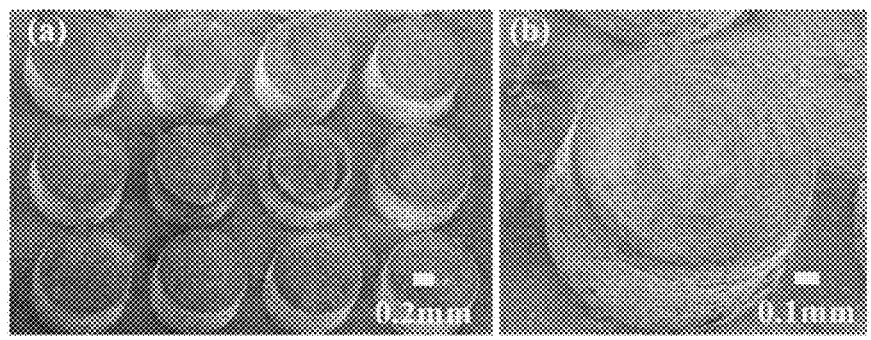
FIG. 2(*a*) is a SEM image of the superhydrophobic PP cylinder pillar arrays on a scale of 0.2 mm.
Figure 3:
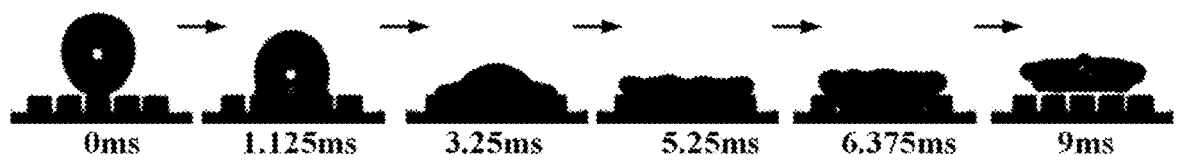
FIG. 3 shows the bouncing dynamics of a water droplet impacting on the superhydrophobic PP cylinder pillar arrays.

(3) Demold: the PP cylinder pillar arrays were prepared by cutting off the excess polymer materials flowing from the through hole in step 2 which could be recycled, and lifting off from the mold. The surface structures are shown in FIG. 2.

(4) Superhydrophobic treatment: the mixed fluoroalkylsilane ethanol solution containing titanium oxide nanoparticles were prepared by adding 6 g titanium oxide nanoparticles (40 nm) into 50 g fluoroalkylsilane ethanol solution. The superhydrophobic PP cylinder pillar arrays were obtained by spraying the mixture onto the PP cylinder pillar arrays fabricated in step 3.

The invention claimed is:

1. A thermal extrusion method to fabricate large-dimension superhydrophobic cylinder pillar arrays with droplet pancake bouncing phenomenon, comprising:

preparing a thermal extrusion mold comprising: obtaining through-hole arrays with 0.8-1.25 mm diameter, 0.25 mm interval space and 0.6-1.0 mm depth on metals, and then rinsing and drying;

based on the obtained mold, polymer plates are first thermally extruded on the mold and cooled to room temperature;

demolding comprising: cutting off excess polymer materials flowing from the through holes and then lifting off polymer cylinder pillar arrays from the mold; and superhydrophobic treatment comprising: obtaining superhydrophobic cylinder pillar arrays via spraying a mixed 1 wt. % fluoroalkylsilane ethanol solution containing titanium oxide nanoparticles on the polymer cylinder pillar arrays and drying in air; the mass ratio of titanium oxide nanoparticles and the mixed solution is not lower than 1:25.

2. The thermal extrusion method as in claim 1, wherein the metals are aluminum, copper, mold steel or stainless steel.

3. The thermal extrusion method in claim 1, wherein the polymer plates are polypropylene, polycarbonate, polyethylene or polytetrafluoroethylene.

* * * * *